(12) United States Patent
Ito et al.

(10) Patent No.: US 7,855,480 B2
(45) Date of Patent: Dec. 21, 2010

(54) RECTIFIER DEVICE FOR AUTOMOTIVE ALTERNATOR

(75) Inventors: Yuji Ito, Hekinan (JP); Shigenobu Nakamura, Anjo (JP)

(73) Assignee: Denso Corporation, Kariya (JP)

( * ) Notice: Subject to any disclaimer, the term of this patent is extended or adjusted under 35 U.S.C. 154(b) by 213 days.

(21) Appl. No.: 12/213,929

(22) Filed: Jun. 26, 2008

(65) Prior Publication Data

US 2009/0059635 A1 Mar. 5, 2009

(30) Foreign Application Priority Data

Aug. 31, 2007 (JP) .............................. 2007-225747
Apr. 1, 2008 (JP) .............................. 2008-094615

(51) Int. Cl.
*H02K 11/00* (2006.01)
*H02K 11/04* (2006.01)
*H02K 19/36* (2006.01)

(52) U.S. Cl. .................... 310/68 D; 363/144; 363/145; 257/693; 257/678; 257/731; 257/694

(58) Field of Classification Search .............. 310/68 D; 363/144, 145; 257/694, 731, 678, 693; *H02K 11/00, H02K 11/04*
See application file for complete search history.

(56) References Cited

U.S. PATENT DOCUMENTS

| | | | |
|---|---|---|---|
| 4,606,000 A * | 8/1986 | Steele et al. | ................. 363/145 |
| 5,424,594 A * | 6/1995 | Saito et al. | ................. 310/68 D |
| 5,828,564 A | 10/1998 | Mori et al. | |
| 5,982,062 A | 11/1999 | Gautier | |
| 6,252,320 B1 * | 6/2001 | Ballard et al. | ............. 310/68 D |

(Continued)

FOREIGN PATENT DOCUMENTS

JP        A-56-10938        2/1981

(Continued)

OTHER PUBLICATIONS

Notice of Reasons for Refusal in Japanese Patent Application No. 2008-094615, dated Mar. 31, 2010 with English translation.

(Continued)

*Primary Examiner*—Quyen Leung
*Assistant Examiner*—John K Kim
(74) *Attorney, Agent, or Firm*—Oliff & Berridge, PLC

(57) ABSTRACT

An AC generator, referred to as an alternator, is mounted on an automotive vehicle for supplying electric power to an on-board battery and other electric loads. The alternator includes a rectifier device for rectifying alternating current to direct current. The rectifier is composed of a minus-side heat-radiating plate on which six minus-side rectifier elements are mounted and a plus-side heat-radiating plate on which six plus-side rectifier elements are mounted. Each rectifier is mounted on the heat-radiating plate in the same manner, i.e., by forcibly inserting the rectifier element into a mounting hole formed in the heat-radiating plate. A disc portion of the rectifier element has an outer peripheral surface on which knurls are formed. The outer peripheral surface having the knurls is tapered so that the disc portion is easily inserted into the mounting hole while establishing a firm grip and a good heat-conductive contact between the rectifier element and the heat-radiating surface.

6 Claims, 5 Drawing Sheets

U.S. PATENT DOCUMENTS

| | | |
|---|---|---|
| 6,455,929 B1 * | 9/2002 | Sheen ................... 257/690 |
| 6,476,480 B1 * | 11/2002 | Staab et al. ............ 257/693 |
| 6,906,437 B2 * | 6/2005 | Aeschlimann et al. .... 310/68 D |
| 7,009,223 B1 * | 3/2006 | Huang ................... 257/177 |
| 7,060,533 B2 * | 6/2006 | Roozrokh et al. ......... 438/115 |
| 2001/0010436 A1 * | 8/2001 | Ballard et al. ........... 310/68 D |
| 2002/0047357 A1 * | 4/2002 | Gautier ................. 310/68 D |
| 2003/0043808 A1 * | 3/2003 | Chen et al. ............. 370/395.1 |
| 2004/0012274 A1 * | 1/2004 | Aeschlimann et al. .... 310/68 D |
| 2006/0097588 A1 | 5/2006 | Nakane |
| 2006/0192446 A1 * | 8/2006 | Ihata et al. ............. 310/68 D |
| 2008/0054766 A1 * | 3/2008 | Kondo ................... 310/68 D |
| 2009/0059635 A1 * | 3/2009 | Ito et al. ................. 363/141 |

FOREIGN PATENT DOCUMENTS

| | | |
|---|---|---|
| JP | A-10-242671 | 9/1998 |
| JP | A-11-313458 | 11/1999 |
| JP | A-2002-119028 | 4/2002 |
| JP | A-2002-238228 | 8/2002 |
| JP | A-2005-166962 | 6/2005 |
| JP | B2 3771637 | 2/2006 |
| JP | A-2006-141126 | 6/2006 |

OTHER PUBLICATIONS

Japanese Office Action issued in Japanese Patent Application No. 2008-094615 on Aug. 10, 2009.

* cited by examiner

FRONT SIDE ← → REAR SIDE

RECTIFIER DEVICE FOR AUTOMOTIVE ALTERNATOR

CROSS-REFERENCE TO RELATED APPLICATIONS

This application is based upon and claims benefit of priority of Japanese Patent Applications No. 2007-225747 filed on Aug. 31, 2007 and No. 2008-94615 filed on Apr. 1, 2008, the contents of which are incorporated-herein by reference.

BACKGROUND OF THE INVENTION

1. Field of the Invention

The present invention relates to a rectifier device for an alternator mounted on an automotive vehicle.

2. Description of Related Art

An alternating current generator, referred to as an alternator, is mounted on an automotive vehicle for charging an on-board battery and for supplying electric power to various devices mounted on the automotive vehicle. Since a large amount of current flows through rectifier elements mounted on the alternator, the rectifier elements are mounted on a heat-radiating plate. An example of such a rectifier device is disclosed in JP-B2-3771637. The rectifier element is composed of a disc portion, a semiconductor element mounted on the disc portion and a lead wire connected to the rectifier element. The rectifier element is connected to the disc portion with solder and sealed with silicone rubber or resin. The rectifier element is mounted on the heat-radiating plate by inserting an outer peripheral portion of the rectifier element having a knurl portion.

In a conventional structure of the rectifier device, the rectifier element is forcibly inserted into a mounting hole of the heat-radiating plate. Since the mounting hole formed in the heat-radiating plate has a diameter that is uniform throughout a thickness of the heat-radiating plate, a local stress is imposed on certain portions of the semiconductor element during a course of forcible insertion of the rectifier element into the heat-radiating plate. This may result in causing damages in the semiconductor element.

SUMMARY OF THE INVENTION

The present invention has been made in view of the above-mentioned problem, and an object of the present invention is to provide an improved rectifier device for an alternator, in which its reliability is enhanced by reducing a stress imposed on a particular portion of a rectifier element in a process of forcibly inserting the rectifier element into a mounting hole of a heat-radiating plate.

An alternator for generating electric power is mounted on an automotive vehicle. The alternator includes a stator fixedly supported between a front frame and a rear frame and a rotor rotatably supported in an inner bore of the stator. A rectifier device for rectifying three-phase alternating current generated in a stator winding into direct current is disposed on the rear frame. The rectifier device includes a minus-side heat-radiating plate on which six minus-side rectifier elements are mounted and a plus-side heat-radiating plate on which six plus-side rectifier elements are mounted.

The minus-side rectifier elements and the plus-side rectifier elements are all forcibly inserted into respective mounting holes formed in the minus-side and the plus side heat-radiating plates. Each rectifier element is composed of a disc portion, a semiconductor chip mounted on a depressed portion of the disc portion and a lead wire connected to the semiconductor chip. The disc portion has a cylindrical outer peripheral surface having knurls formed thereon. A diameter of a top end of the outer peripheral surface, from which the disc portion is forcibly inserted into the mounting hole, is made smaller than a diameter of a bottom end, which is opposite to the top end. In other words, the outer peripheral surface having knurls thereon is tapered.

The rectifier element is smoothly inserted into the mounting hole without forming damages or scars on the inner bore of the mounting hole. At the same time, the rectifier element is firmly gripped in the mounting hole, and a good heat-conductive contact between the rectifier element and the heat-radiating plate is established. Thus, heat generated in the rectifier element is effectively dissipated, thereby enhancing reliability of the rectifier device and prolonging its lifetime. Projecting peaks of the knurls formed on the outer peripheral surface of the disc portion may be made higher at its top end than at its bottom end. Heat-conductive grease may be disposed between the outer peripheral surface and the mounting hole to further improve the heat-conductivity.

The mounting hole may be tapered so that its diameter becomes gradually smaller from the bottom end (from which the rectifier element is inserted) toward the top end, instead of making the outer peripheral surface of the disc portion a tapered surface. A width of the projecting peaks of the knurls may be made wider at the bottom end of the outer peripheral surface than at its top end. The number of projected portions of the knurls may be made larger at a bottom portion of the outer peripheral surface than at its top portion. A hardness of the knurls may be made harder at the bottom portion of the outer peripheral surface than its top portion.

According to the present invention, the rectifier element is smoothly inserted into the mounting hole while establishing a firm grip and a good heat-conductive contact between the rectifier element and the heat-radiating plate. Other objects and features of the present invention will become more readily apparent from a better understanding of the preferred embodiments described below with reference to the following drawings.

DETAILED DESCRIPTION OF THE PREFERRED EMBODIMENTS

Figure 1:
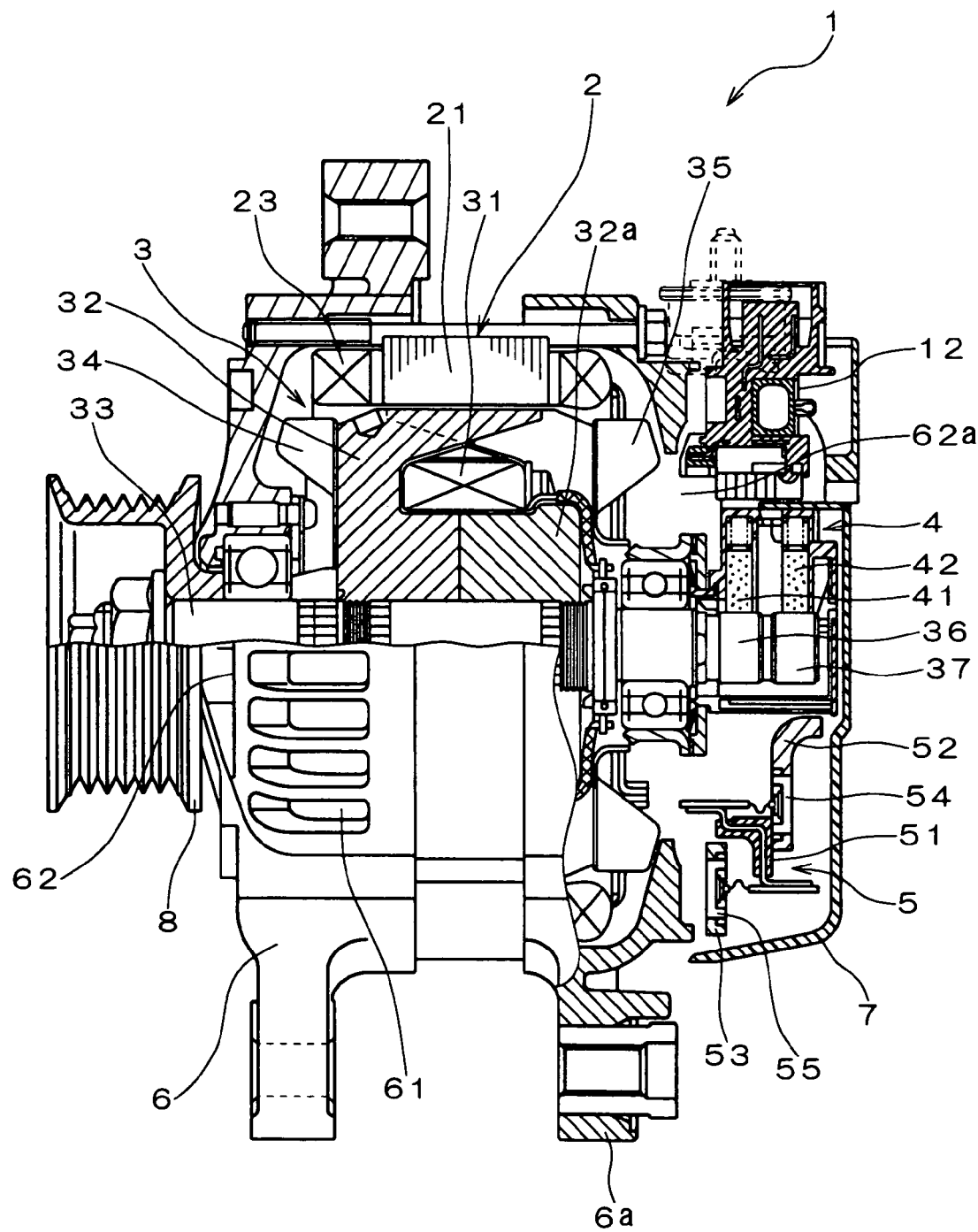
FIG. 1 is a cross-sectional view showing an alternator on which a rectifier device according to the present invention is mounted.

A first embodiment of the present invention will be described with reference to FIGS. 1-4. First, referring to FIG. 1, an entire structure of an alternator on which a rectifier device according to the present invention is mounted will be described. The alternator 1 includes a stator 2, a rotor 3, a brush device 4, a rectifier device 5, a front frame 6, a rear frame 6a, a rear cover 7, a pulley 8 and other associated components. A front side and a rear side of the alternator 1 are indicated in FIG. 1 with arrows.

The stator 2 is composed of a stator core 21 and a three-phase winding 23 disposed in slots formed in the stator core. The rotor includes a pair of pole cores (a front pole core 32 and a rear pole core 32a) that are fixedly connected to a rotor shaft 33 and a field winding coaxially wound on the pair of rotor cores 32, 32a. The pair of pole cores 32, 32a, each having plural claws, is connected to the rotor shaft 33 to face each other. The field winding 31 is wound in a space between the pair of rotor cores 32, 32a. A cooling fan 34 is connected to the front pole core 32 by welding or the like, and another cooling fan 35 is similarly connected to the rear pole 32a.

A pair of slip-rings 36, 37 is connected to the rear end of the rotor shaft 33, and brushes 41, 42 of the brush device 4 slidably contact the slip-rings to supply excitation current to the field winding 31. The rectifier device 5 for rectifying three-phase alternating current into direct current is supported on the rear frame 6a. The rectifier device 5 includes a terminal base 51 having lead wires, a plus-side heat-radiating plate 52 and a minus-side heat-radiating plate 53. Both heat-radiating plates 52, 53 are positioned with a certain space apart from each other, as shown in FIG. 1. Plural plus-side rectifier elements 54 are connected to the plus-side heat-radiating plate 52 by forcibly inserting each plus-side rectifier element 54 into respective mounting holes. Plural minus-side rectifier elements 55 are similarly connected to the minus-side heat-radiating plate 53. An IC regulator 12, which controls an amount of current supplied to the field winding 31 to thereby control an output voltage of the alternator, is also disposed at the rear side of the alternator 1.

The stator 2 is fixedly held between the front frame 6 and the rear frame 6a, and the rotor 3 is rotatably supported by bearings held in the frames 6, 6a. The rotor 3 is disposed in an inner bore of the stator 2, forming a small air gap therebetween. Inlet windows 62 for introducing cooling air into the alternator and outlet windows 61 for exhausting the cooling air are formed on the front frame 6. The cooling air is introduced in the axial direction and exhausted in the radial direction, thereby cooling the stator windings 23 and other components. Similarly, cooling air is also introduced into the alternator 1 through the inlet windows 62a of the rear frame 6a and exhausted in the radial direction. The rear cover 7 covers the brush device 4, the rectifier device 5 and the IC regulator 12, all disposed outside the rear frame 6a.

The rotor 3 of the alternator 1 is driven by an engine of an automotive vehicle through a V-belt or the like coupled to the pulley 8. The field winding 31 of the rotor 3 generates a magnetic field by supplying excitation current thereto. Three-phase alternating current is generated in the stator winding 23 in the magnetic field supplied from the rotating rotor 3. The alternating current is rectified by the rectifier device 5 into direct current, and the direct current is supplied to the on-board battery and other electric components mounted on the vehicle.

Figure 2:
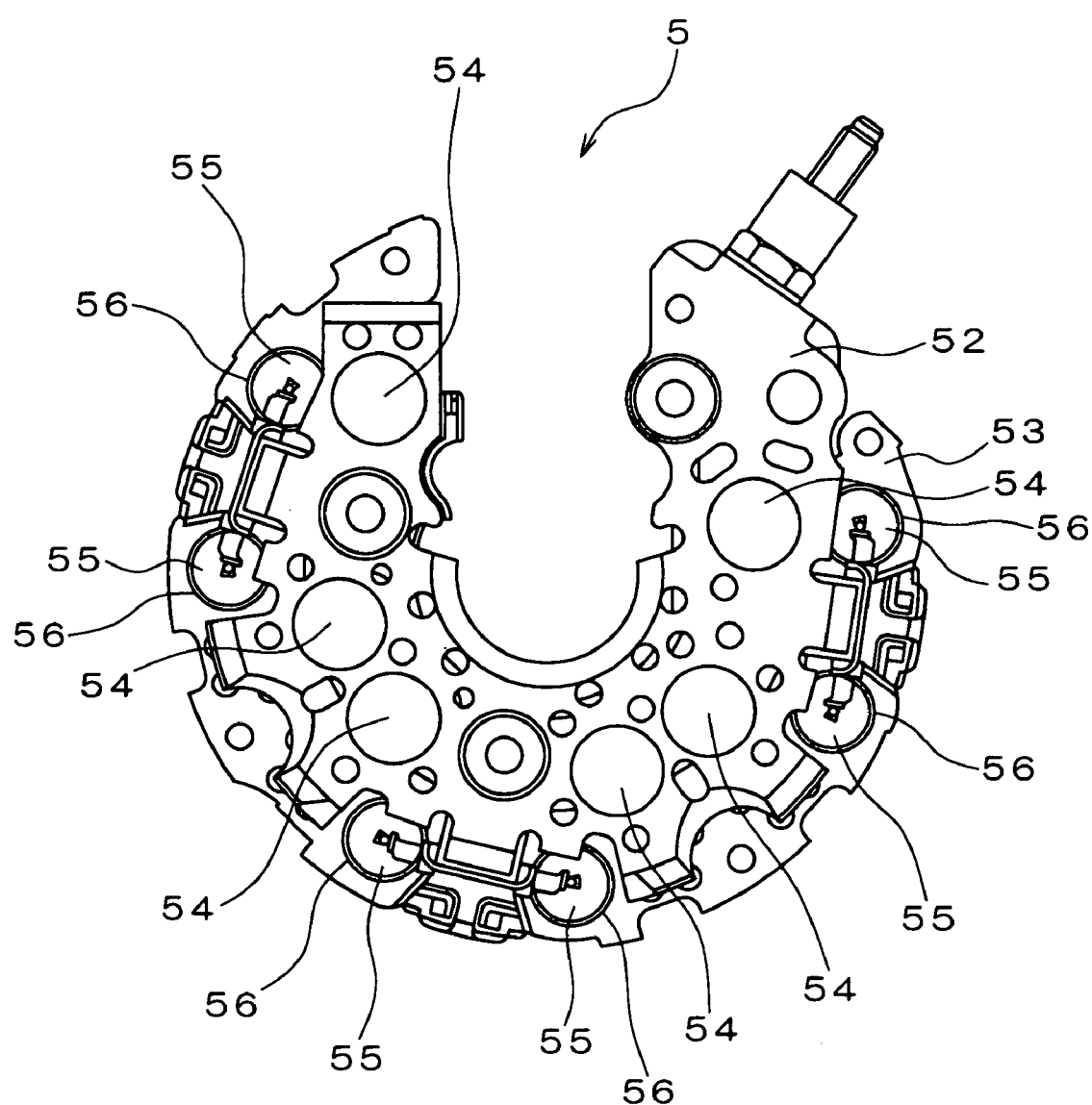
FIG. 2 is a plan view showing the rectifier device used in the alternator shown in FIG. 1.
Figure 3:
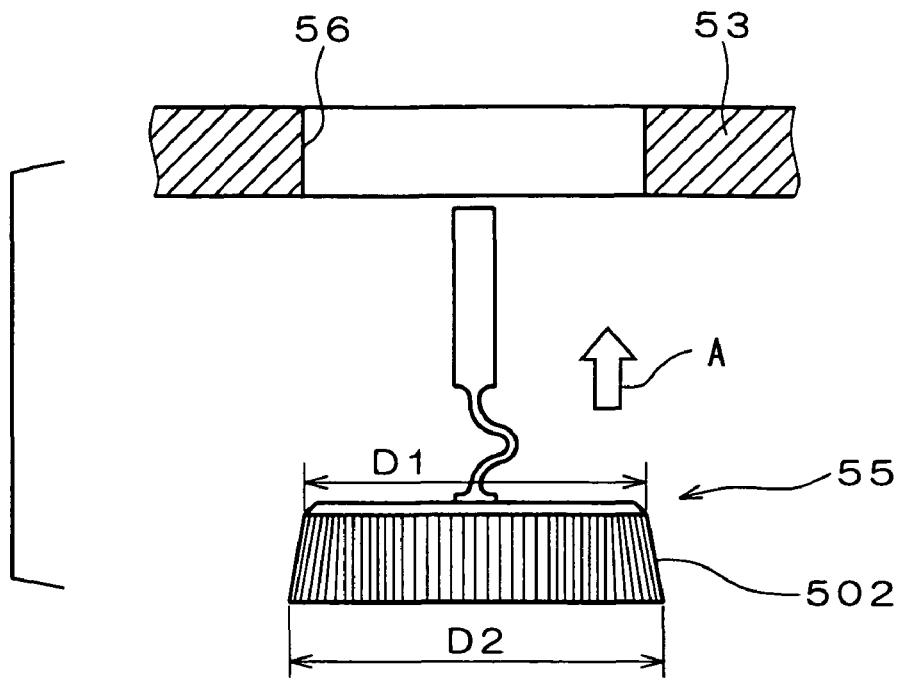
FIG. 3 is a partial cross-sectional view showing a heat-radiating plate and a rectifier element to be inserted into a mounting hole of the heat-radiating plate, as a first embodiment of the present invention.
Figure 4:
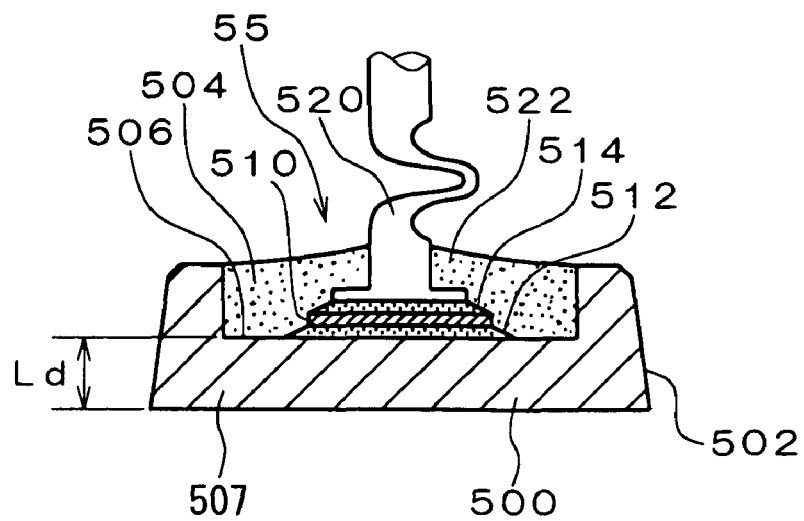
FIG. 4 is a cross-sectional view showing a rectifier element used in the rectifier device.

With reference to FIGS. 2-4, the rectifier device 5 having the plus-side heat-radiating plate 52 and the minus-side heat-radiating plate 53 will be described in detail. Since the rectifier elements are connected to the mounting holes of the plus-side and minus-side heat radiating plates 52, 53 in the same manner, a structure for connecting the minus-side rectifier element 55 to the minus-side heat-radiating plate 53 will be described below as a representative. As shown in FIG. 2, six plus-side rectifier elements 54 are connected to the plus-side heat-radiating plate 52, and six minus-side rectifier elements 55 are connected to the minus-side heat-radiating plate 53. These rectifier elements 54, 55 are connected to respective heat-radiating plates 52, 53 by forcibly inserting them into respective mounting holes. The process of mounting the rectifier elements on the heat-radiating plates is simplified by using the forcible insertion, compared with soldering the rectifier elements to the heat-radiating plates. A manufacturing cost in the mounting process is also reduced.

As shown in FIG. 3, the minus-side rectifier element 55 is forcibly inserted into a mounting hole 56 formed in the minus-side heat-radiating plate 53. A direction of the insertion is shown by an arrow "A" in FIG. 3. As shown in FIG. 4, the rectifier element 55 is composed of a disc portion 500, a semiconductor chip 510 and a lead wire 520. A depressed portion 504 having a depressed surface 506 is formed in the disc portion 500. A bottom base 507 having a thickness Ld is formed at a bottom end of the disc portion 500. The semiconductor chip 510 is connected to the depressed surface 506 by soldering, and the lead wire 520 is connected to the semiconductor chip 510 by soldering. A protecting layer 522 made of a material such as silicone rubber or resin is disposed in the depressed portion 504 to entirely cover the semiconductor chip 510.

As shown in FIGS. 3 and 4, the disc portion 500 has an outer peripheral surface 502 on which knurls are formed along the insertion direction "A". A diameter D1 of a top end of the disc portion 500 is made smaller than a diameter D2 of a bottom end. That is, the outer peripheral surface 502 having the knurls formed thereon is tapered. A diameter of the mounting hole 56 is made a little smaller than the diameter D1. Heat-conductive grease is painted either on the outer peripheral surface 502 or on an inner bore of the mounting hole 56, or both, before the rectifier element 55 is forcibly inserted into the mounting hole 56. The heat-conductive grease may not be necessary if sufficient heat conduction between the rectifier element 55 and the heat-radiating plate 53 is achieved without using the heat-conductive grease.

Advantages attained in the first embodiment described above will be summarized below. Since the outer peripheral surface 502 having the knurls is tapered (D1<D2), the rectifier element 55 is smoothly inserted into the mounting hole 56 while securing a force necessary for firmly connecting the rectifier element 55 to the heat-radiating plate 53. Formation of damages on the inner bore of the mounting hole 56 due to concentration of stress to particular portions in the insertion process is avoided. Thus, a sufficient contacting area between the rectifier element 55 and the mounting hole is secured, and thereby heat generated by the rectifier element 55 is properly radiated from the heat-radiating plate 53.

Further, since the heat-conductive grease is disposed between the outer peripheral surface 502 and the inner bore of the mounting hole 56, heat generated in the rectifier element 55 is effectively conducted to the heat-radiating plate 53 even if there is a certain decrease in the contacting area due to surface damages caused in the insertion process. Since the bottom base 507 receives a connecting force between the rectifier element 55 and the mounting hole 56, it is avoided that a stress is imposed on the semiconductor chip 510, thereby preventing damages on the semiconductor chip 510 and soldered connection from being peeled off.

The knurls formed on the outer peripheral surface 502 are composed of projected peaks and depressed valleys, both running along the insertion direction "A". It is preferable to make a height of the peaks (in the radial direction of the disc portion 500) higher at the top end than at the bottom end. In this manner, the higher peaks at the top end are deformed and firmly connected to the inner surface of the mounting hole 56 in the insertion process. Thus, the rectifier element 55 is further firmly connected to the heat-radiating plate 53 to thereby conduct heat further efficiently.

Figure 5:
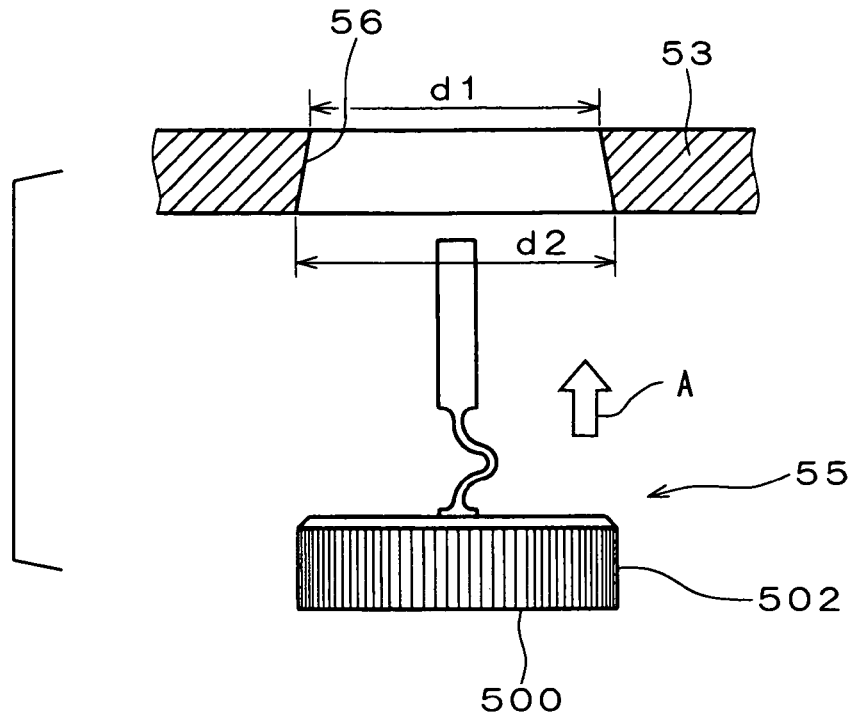
FIG. 5 is a partial cross-sectional view showing a heat-radiating plate and a rectifier element to be inserted into a mounting hole of the heat-radiating plate, as a second embodiment of the present invention.

A second embodiment of the present invention is shown in FIG. 5. In this embodiment, the outer peripheral surface 502 having the knurls thereon is not tapered but has a uniform diameter. Instead, the mounting hole 56 is tapered, i.e., a diameter d2 of its bottom end is made larger than a diameter d1 of its top end (d2>d1). The bottom diameter d2 of the mounting hole 56 is made a little larger than the diameter of the outer peripheral surface 502. Other structures are the same as those of the first embodiment.

Since the mounting hole 56 is tapered (d2>d1), the rectifier element 55 is smoothly inserted into the mounting hole 56 while firmly connecting the rectifier element 55 to the heat-radiating plate 53. It is avoided that damages are formed on the inner surface of the mounting hole 56 in the insertion process, and thereby a good heat-conductive contact is established between the rectifier element 55 and the heat-radiating plate 53.

Figure 6:
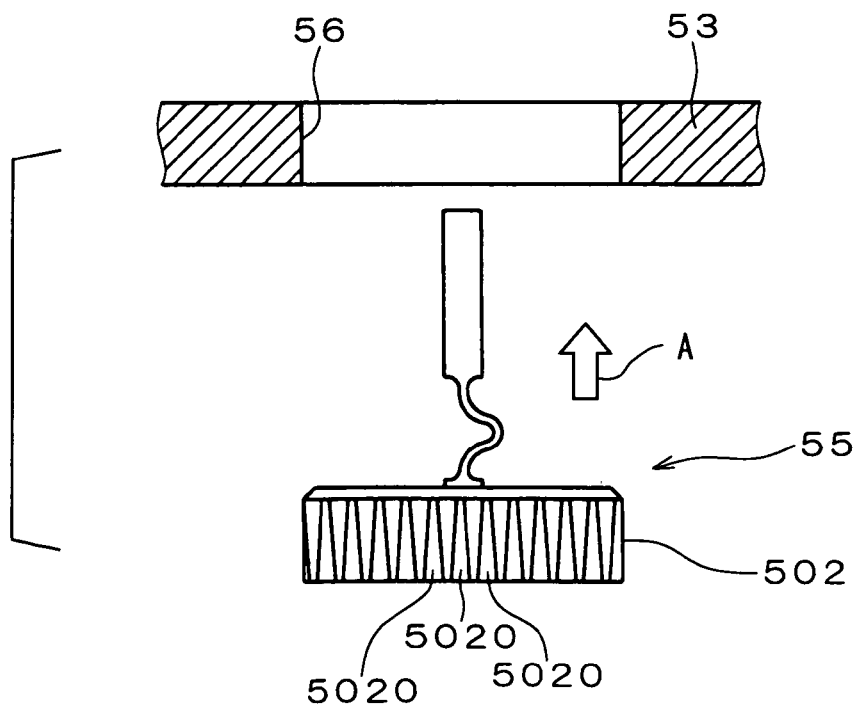
FIG. 6 is a partial cross-sectional view showing a heat-radiating plate and a rectifier element to be inserted into amounting hole of the heat-radiating plate, as a third embodiment of the present invention.

A third embodiment of the present invention is shown in FIG. 6. In this embodiment, both of the mounting hole 56 and the outer peripheral surface 502 are made to have a uniform diameter, i.e., not tapered. Instead, a width of the projected peaks 5020 of the knurls, measured in a circumferential direction along the outer peripheral surface 502, is made wider at the bottom end of the disc portion 500 than at its top end. In this manner, an amount of engagement of the knurls with the inner bore of the mounting hole 56 (a biting amount of the projected peaks 5020 in the inner bore of the mounting hole 56) can be made smaller at the top end of the outer peripheral surface 502 than at its bottom end. Therefore, the rectifier element 55 is smoothly inserted into the mounting hole 56 while establishing a good heat-conductive contact. Similar advantages as attained in the first and second embodiments are attained in this third embodiment.

Figure 7:
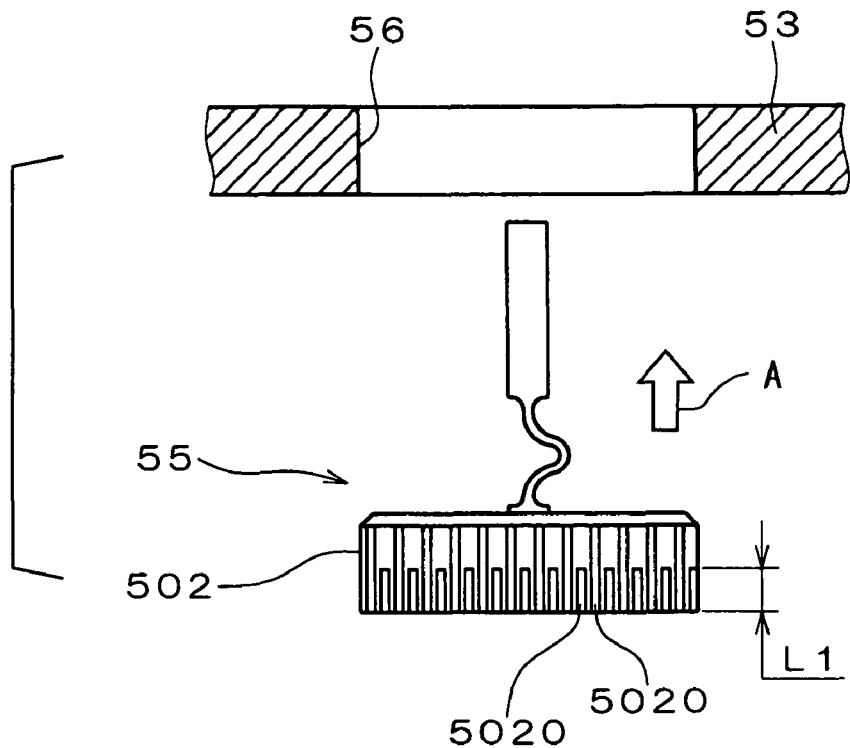
FIG. 7 is a partial cross-sectional view showing a heat-radiating plate and a rectifier element to be inserted into a mounting hole of the heat-radiating plate, as a fourth embodiment of the present invention.

A fourth embodiment of the present invention is shown in FIG. 7. In this embodiment, both of the outer peripheral surface 502 and the mounting hole 56 are made to have a uniform diameter, not tapered, as in the third embodiment. Instead, the number of projected peaks 5020 of the knurls formed on the outer peripheral surface 502 is made larger at its bottom end portion than its top end portion. It is preferable to make the length L1 of the bottom end portion, where the higher number of projected peaks 5020 are formed, larger than the thickness Ld (refer to FIG. 4) of the bottom base 507 of the disc portion 500. Other structures of the rectifier device are the same as those of the foregoing embodiments.

By making the number of projected peaks 5020 smaller at the top end portion than the bottom end portion of the outer peripheral surface 502, an amount of engagement of the projected portions with the inner bore of the mounting hole 56 is made smaller at the top portion. Accordingly, the rectifier element 55 can be smoothly inserted into the mounting hole 56 while establishing a good heat-conductive contact between the rectifier element 55 and the heat-radiating plate 53.

Figure 8:
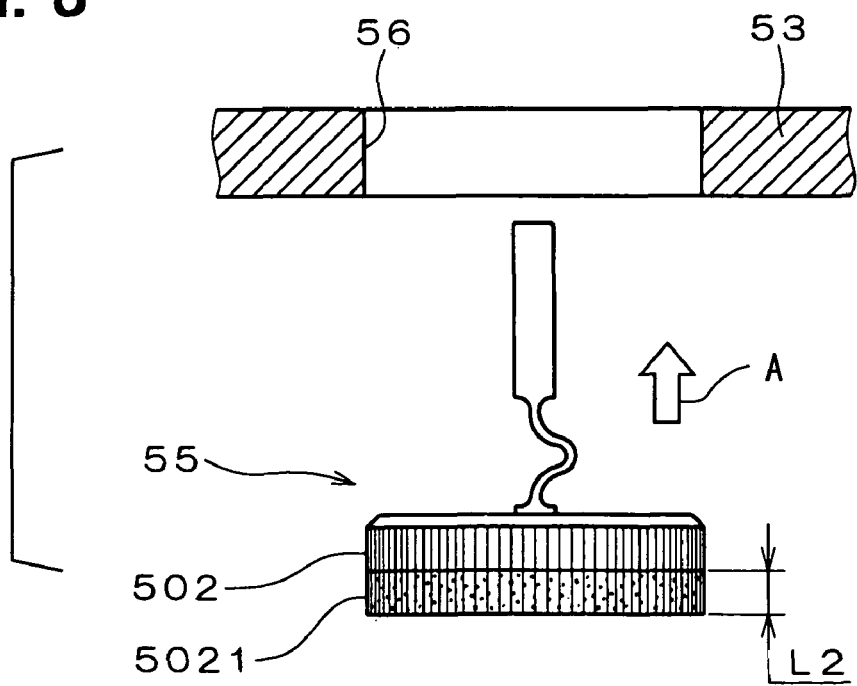
FIG. 8 is a partial cross-sectional view showing a heat-radiating plate and a rectifier element to be inserted into amounting hole of the heat-radiating plate, as a fifth embodiment of the present invention.

A fifth embodiment of the present invention is shown in FIG. 8. In this embodiment, both of the mounting hole 56 and the outer peripheral surface 502 are not tapered. Instead, a hardness of the knurls formed on the outer peripheral surface 502 is made higher in its bottom portion (portion having a length L2) than its top portion. The bottom portion may be covered with a plated layer 5021 to thereby increase hardness. It is preferable to make the length L2 having the higher hardness longer than the thickness Ld of the bottom base 507 of the disc portion 500. Other structures are the same as those of the foregoing embodiments. Since the top portion of the outer peripheral surface 502 is softer than the bottom portion, the rectifier element 55 is smoothly inserted into the mounting hole 56 while establishing a good heat-conducting contact between the rectifier element 55 and the heat-radiating plate 53.

The present invention is not limited to the embodiments described above, but it may be variously modified. Though the rectifier device of the present invention is used in the alternator, the rectifier device may be used in a system or apparatus other than the alternator. While the present invention has been shown and described with reference to the foregoing preferred embodiments, it will be apparent to those skilled in the art that changes in form and detail may be made therein without departing from the scope of the invention as defined in the appended claims.

What is claimed is:

1. A rectifier device comprising:
   a plate for radiating heat having a mounting hole; and
   a rectifier element forcibly inserted into the mounting hole of the heat-radiating plate, wherein:
   the rectifier element includes a disc portion and a semiconductor chip mounted on the disc portion;
   the disc portion includes a cylindrical outer peripheral surface having knurls formed thereon, a bottom base and a depressed portion having a depressed surface;
   a diameter of a top end of the disc portion, from which the disc portion of the rectifier element is forcibly inserted into the mounting hole, is made smaller than a diameter of a bottom end, which is opposite to the top end, of the disc portion; and
   a height of the knurls in a radial direction of the disc portion is lower at the bottom end of the disc portion than at the top end of the disc portion.

2. A rectifier device comprising:
   a plate for radiating heat having a mounting hole; and
   a rectifier element forcibly inserted into the mounting hole of the heat-radiating plate, wherein:
   the rectifier element includes a disc portion and a semiconductor chip mounted on the disc portion;
   the disc portion includes a cylindrical outer peripheral surface having knurls formed thereon, a bottom base and a depressed portion having a depressed surface; and
   a width of projected peaks of the knurls is made narrower at a top end of the disc portion, from which the disc portion of the rectifier element is forcibly inserted into the mounting hole, than at a bottom end of the disc portion which is opposite to the top end.

3. The rectifier device as in claim 1 or claim 2, wherein the bottom base is positioned underneath the depressed portion and corresponds to the bottom end of the disc portion.

4. A rectifier device comprising:
 a plate for radiating heat having a mounting hole; and
 a rectifier element forcibly inserted into the mounting hole of the heat-radiating plate, wherein:
 the rectifier element includes a disc portion and a semiconductor chip mounted on the disc portion;
 the disc portion includes a cylindrical outer peripheral surface having knurls formed thereon, a bottom base and a depressed portion having a depressed surface; and
 hardness of the knurls is made lower at a top end of the disc portion, from which the disc portion of the rectifier element is forcibly inserted into the mounting hole, than at a bottom end of the disc portion which is opposite to the top end.

5. The rectifier device as in claim 4, wherein the hardness of the knurls is made higher in a predetermined length from the bottom end of the disc portion than at the top end of the disc portion by plating a surface of the knurls, and the predetermined length is longer than a thickness of the bottom base of the disc portion.

6. The rectifier device as in any one of claims 1, 2 and 4, wherein heat-conductive grease is disposed between the outer peripheral surface of the disc portion and the mounting hole.

* * * * *